United States Patent [19]

Elmer et al.

[11] 3,986,172

[45] Oct. 12, 1976

[54] CCD REGISTER INTERFACE WITH PARTIAL-WRITE MODE

[75] Inventors: Ben R. Elmer, Glendale; Wallace E. Tchon, Phoenix, both of Ariz.

[73] Assignee: Honeywell Information Systems, Inc., Phoenix, Ariz.

[22] Filed: June 30, 1975

[21] Appl. No.: 591,723

[52] U.S. Cl. .......................... 340/172.5; 307/DIG. 3
[51] Int. Cl.² .................... G06F 13/00; H03K 5/00
[58] Field of Search ............... 340/172.5; 307/231, 307/235 R, 235 A, DIG. 3; 324/98

[56] References Cited
UNITED STATES PATENTS

| | | | |
|---|---|---|---|
| 3,237,164 | 2/1966 | Evans | 340/172.5 X |
| 3,242,467 | 3/1966 | Lamy | 340/172.5 |
| 3,470,542 | 9/1969 | Trantanella | 340/172.5 X |
| 3,644,901 | 2/1972 | Zingg | 340/172.5 |

*Primary Examiner*—Gareth D. Shaw
*Assistant Examiner*—Melvin B. Chapnick
*Attorney, Agent, or Firm*—William W. Holloway, Jr.; Nicholas Prasinos; Ronald T. Reiling

[57] ABSTRACT

Interface circuitry for a charged coupled device (CCD) register system. The circuitry enables a PARTIAL-WRITE mode of operation on a CCD storage register. A data bus, which may be bi-directional, is coupled to the sense amplifier of the CCD storage register. The coupling is via interface circuitry responsive to control signals for enabling the register and also enabling a WRITE operation. Discontinuation of the WRITE signals frees the data bus for other uses, thereby allowing for a PARTIAL-WRITE mode of operation. The interface circuitry is simplified so as to require a minimum of space, thereby enhancing the density characteristics of the CCD storage system.

7 Claims, 5 Drawing Figures

CCD REGISTER INTERFACE WITH PARTIAL-WRITE MODE

RELATED APPLICATIONS

The following applications assigned to the same assignee named herein are incorporated by reference to the instant application:

No. 1. "Multiphase Series-Parallel-Series Charge Coupled Device Registers" invented by Ben R. Elmer, et al., Ser. No. 592,156, filed on June 30, 1975.

No. 2. "Multiphase Series-Parallel-Series Charge Coupled Device Registers With Simplified Input Clocking" invented by Ben R. Elmer et al., Ser. No. 591,724, filed on June 30, 1975.

No. 3. "Charge Injectors For CCD Registers" invented by Wallace E. Tohon, Ser. No. 592,147, filed on June 30, 1975.

No. 4. "Charge Detectors For CCD Registers" invented by Ben R. Elmer et al., Ser. No. 591,667, filed on June 30, 1975.

No. 5. "Chain Selection Scheme In A Fault-Tolerant Mode And Circuits For Implementing Same", invented by Ben R. Elmer, Ser. No. 592,155, filed on June 30, 1975.

No. 6. "Fault-Tolerant CCD Memory Chip", invented by Ben R. Elmer, et al., Ser. No. 591,666, filed on June 30, 1975.

BACKGROUND OF THE INVENTION

1. Field of the Invention

The present invention relates to interfaces for CCD register systems and in particular to interface circuitry for allowing for a PARTIAL-WRITE operation on a CCD storage register.

2. Description of the Prior Art

In order to effectively utilize CCD technology, high density must be obtained. The smallest possible cell sites for storage of charge is desirable as well as an optimum spacial configuration of cell sites within a register in order to achieve high density. In practical applications of CCDs, the density problem is present not only at this configurational level, but also with respect to circuitry required for interfacing between registers and the rest of the data processing system. This communication takes place via data buses or possibly via a single bi-directional data bus. Obviously, in the latter case, less space is required and higher system density is possible. Similarly, if circuits for controlling the input and output of signals to these registers are designed to occupy a minimum amount of space, then higher densities will result.

High-density CCD storage registers are described in Related Applications Nos. 1 and 2. They have the capacity for storing a high number of bits, 256, in a relatively small amount of space. During any cycle of operation (i.e. READ, WRITE or REFRESH), all 256 bits are transferred into the register. However, during WRITE cycles, it is often a wasteful operation to bus all 256 bits from the rest of the system, since it is often required to WRITE (store) less than 256 bits. Typically, blank bits are written during each cycle. If interface circuitry can be provided which allows for a PARTIAL-WRITE mode operation, then system efficiencies would result. Specifically, a PARTIAL-WRITE in this context denotes utilization of other (other than the CCD register system) system components for only that period of time (or for that number of bits) required for transmission of bits of present interest. After such a PARTIAL-WRITE is completed, the other system components are no longer dedicated to performance of the transmission task and may be assigned to performance of other tasks. In this manner, overall system efficiency is increased. In other words, if interface circuitry can be provided for enabling a PARTIAL-WRITE operation, efficiencies in other parts of the data processing system are possible. Unfortunately, with respect to CCD technology, prior art PARTIAL-WRITE circuitry has been either complex and/or space consuming. This is in direct contrast with the CCD requirement of high density and cost savings.

OBJECTS OF THE INVENTION

It is an object of the present invention therefore to provide for I/O interface for CCD register systems which requires a minimum of space.

It is another object of the present invention to provide an I/O interface for CCD register systems which can operate in a PARTIAL-WRITE mode.

It is a further object of the present invention to provide an I/O interface which utilizes a bi-directional data bus.

It is yet a further object of the present invention to provide an I/O interface in conjunction with highly-sensitive amplifier circuitry for effecting a high-density CCD register system.

Other objects and benefits of the present invention will become more apparent to those of ordinary skill in the art when read in conjunction with the drawings contained herein.

SUMMARY OF THE INVENTION

The invention comprises interface circuitry for a CCD register system. The interface circuitry is designed to work in combination with a sense amplifier coupled to the output terminal of a CCD register. The sense amplifier comprises a differentiator which receives charge packets from the CCD register and from a reference injector. The differentiator is responsive to a regenerator circuit, but this responsiveness is disabled by the interface circuitry during a WRITE operation. Upon actuation in a READ or REFRESH mode, the differentiator amplifies the output signal from the CCD register and provides a corresponding logic level signal. During a REFRESH and READ operation, the inverse of the logic level signal is sent to a first amplifier. Also, during a READ operation, the logic level signal is sent through a second amplifier to a data bus. During a WRITE operation, the first amplifier receives a logic signal from a data bus. The first amplifier transmits signals to an injector circuit for the CCD register. Upon discontinuation of a WRITE signal, the CCD register completes a cycle of operation in the equivalent of REFRESH mode. In this manner, a PARTIAL-WRITE mode is effectuated.

DESCRIPTION OF THE PREFERRED EMBODIMENT

Figure 1:
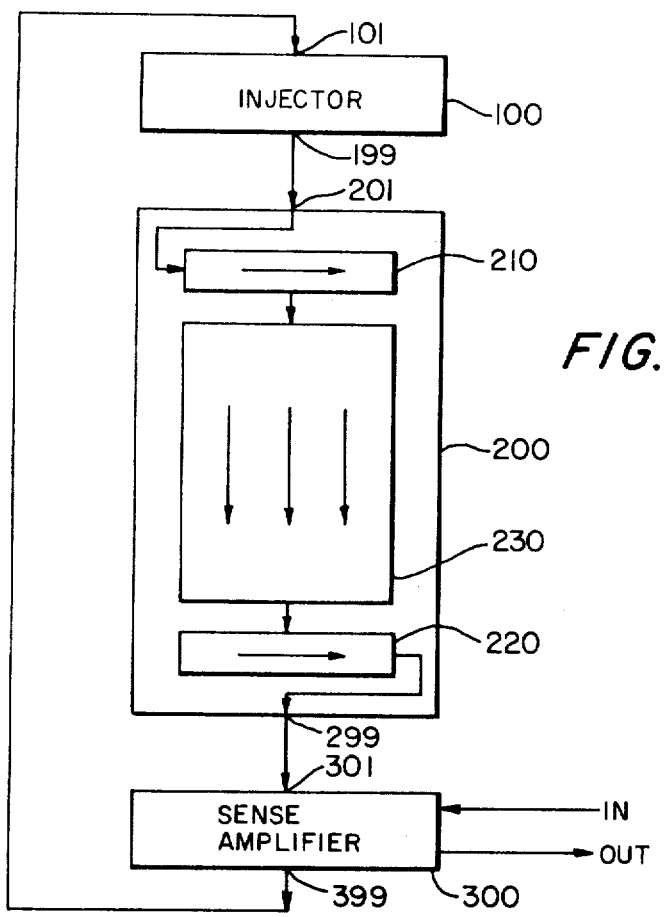
FIG. 1 is a block diagram of an SPS CCD register with an associated injector and sense amplifier.

Referring now to FIG. 1, a block diagram of a CCD register storage system is shown. All of the components in the CCD register storage system are integrated within a single semiconductor chip which may contain a plurality of such register systems. (For additional details, see Related Application No. 6.) It is noted that a single line connecting various blocks within FIG. 1 may represent a plurality of connecting leads. Also, the unconnected arrowheads in FIG. 1 represent direction of flow of information bits. The basis element of FIG. 1 is block 200 which represents a series-parallel-series (SPS) register. SPS register 200 is comprised of three units: input serial register 210, output serial register 220 and central storage register 230. The input terminal 201 of register 200 is effectively the input terminal to input serial register 210. Bits of information in the form of charge packets are injected into input section 210 and are serially propagated through section 210. CCD sites (or cells) comprising section 210 are also connected to central section 230. Section 210 is coupled to section 230 via a row of gates which allows parallel transfer of information into central section 230. Information bits are then propagated through the lengthwise section of central section 230. In the preferred embodiment, central section 230 is eight bits wide by 32 effective bits long, thereby providing a 256-bit shift register. The arrows inside of section 230 represent the parallel propagation of information through section 230. At the other (output) end of section 230, the information bits in the form of charge packets are transferred into output serial section 220. Upon receiving the information bits, output section 220 transfers the bits serially to the output section output terminal, which is effectively the output terminal 299 of SPS register 200.

SPS register 200 receives, transfers, and transmits information in the form of small packets of charge, in the order of 50 to 230 $\times 10^{-15}$ Coulombs. Clearly, these charges are not of a level equivalent to logic signals at a system level. Accordingly, the register must be buffered in order to handle and transmit appropriate input and output signals.

The packets of charge emitted from SPS register 200 must be sensed and amplified, i.e. refreshed, before further propagation. Additionally, they must be converted to appropriate logic levels before they can be bused to other system components. This is accomplished by sense amplifier 300 which has its input terminal 301 coupled to the output terminal 299 of SPS register 200. Amplifier 300 must be highly sensitive to be able to sense the very small packets of charge after they have been transferred through and decayed within the shift register 200. It is also desirable to periodically perform a conventional REFRESH of the information bits stored in the register 200. This is performed by simply serially shifting the packets of charge from the register to the amplifier, and reinjecting them after they have been amplified. This operation is identical to a READ operation with the exception that the latter also entails busing the information, at a logic level, to other system components. Such output busing is done over output line OUT shown in FIG. 1.

Input busing may be done via line IN to amplifier 300. Accordingly, in this CCD storage system, amplifier 300 is considered to include interface circuitry responsive to control signals for directing the flow of information through the system to perform REFRESH, READ and WRITE operations. The present invention is directed to an amplifier with interface circuitry, such as sense amplifier 300.

An output terminal 399 of amplifier 300 is also connected to the input terminal 101 of injector circuit 100, thereby forming an input path to register 200. Injector 100 acts to convert the system level signals into appropriate charge packets. These charge packets are then transferred from the output terminal 199 of injector circuit 100 to the input terminal 201 of register 200. (For detailed description of injector 100, see Related Application No. 3; and of the SPS registers, see Related Application Nos. 1 and 2.)

Figure 2:
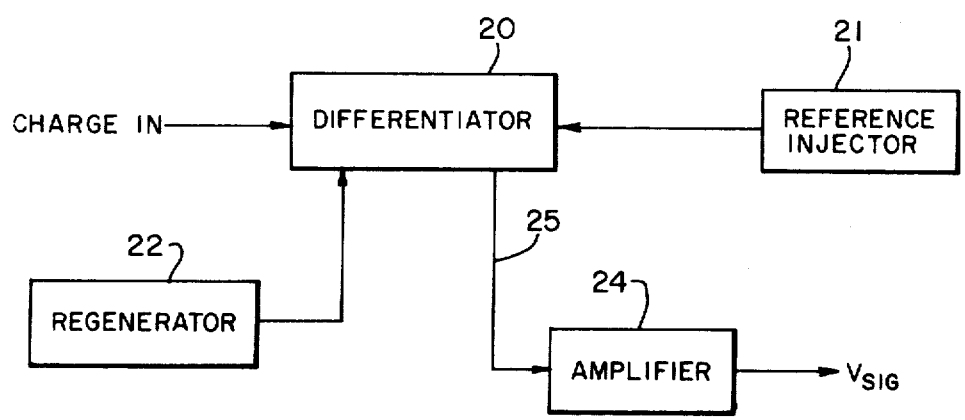
FIG. 2 is a block diagram of a sense amplifier for a CCD register.

Referring now to FIG. 2, the basic components or amplifier 300 are shown in block diagram form. It is noted that this amplifier does not contain circuitry for interfacing with an I/O bus. Such a modified amplifier is shown and described in this disclosure, and in particular with reference to FIG. 4. Differentiator 20 receives two charge packets. CHARGE IN is the signal charge packet transmitted from the output terminal 299 of the CCD storage register; the second charge packet is the reference charge transmitted by the reference injector 21. A third input to differentiator 20 comes from regenerator 22. This input however is a control signal. The output signal from differentiator 20 is a system level logical zero or one. This signal is inverted and further amplified by amplifier 24 and than used as an input signal $V_{SI_U}$ to the injector 100.

Figure 3:
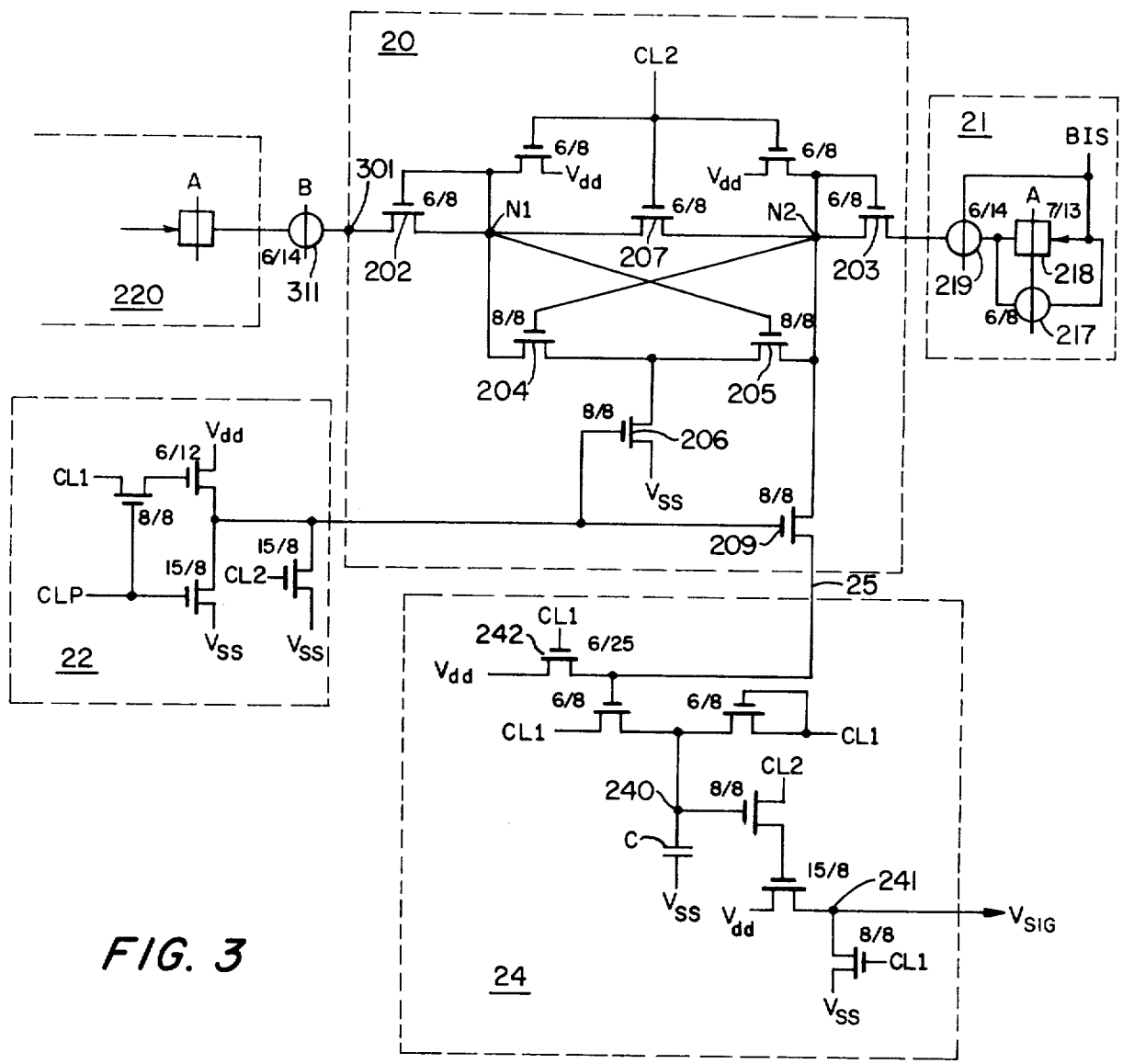
FIG. 3 is a detailed circuit diagram of the sense amplifier shown in FIG. 2.
Figure 4:
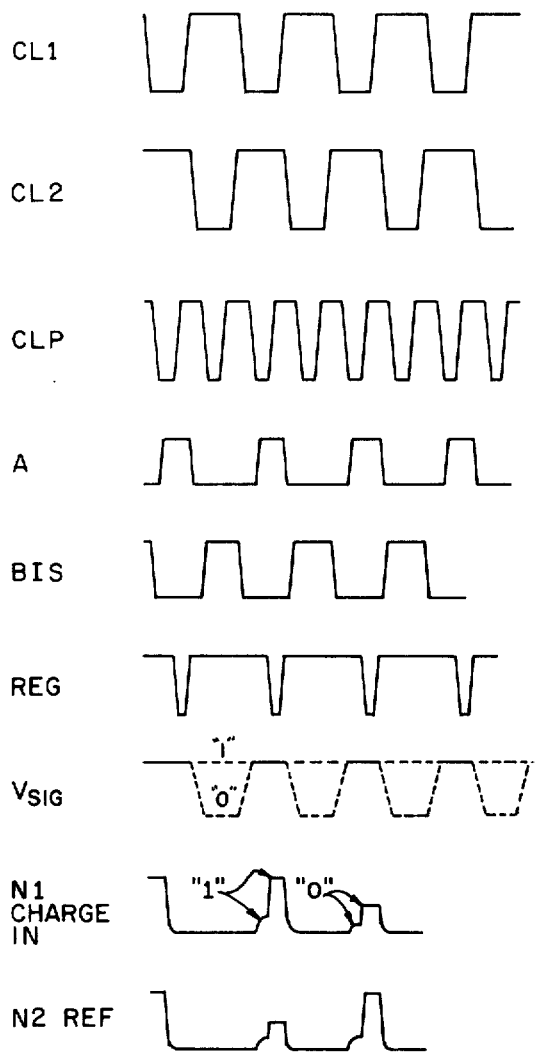
FIG. 4 is a timing diagram showing the relationships between phase drivers used in the sense amplifier shown in FIG. 3.

Referring now to FIGS. 3 and 4, the detailed circuitry of the invention and the timing of the phases used in connection with this circuitry are shown respectively. Circuitry for the phases is shown in Related Application Nos. 1 and 2. Reference injector 21 comprises sites 217 and 218 with their electrodes coupled to phase A and gating site 219 with its electrode coupled to phase BIS. (Site 218 is partially implanted forming an input barrier region of about 7 × 8 microns square and sites 217 and 219 are fully implanted forming barrier regions of about 6 × 8 and 6 × 14 microns square respectively. Site 217 is used to develop a "fat zero" charge packet and site 218 is used to develop a charge packet equal to about one-half of a signal charge packet. Charge packets from both sites 217 and 218 are commonly fed into gating site 219. Phase BIS is the clocked source for reference charge injection. The common usage of phase BIS as the clocked source to sites 217 and 218 and the gating signal for gating site 219 results in gating site 219 being an effective forward blocking gate for injection of reference charge packets into differentiator 20. Phase BIS is a 1 MHZ pulse train and is identical to phase B except that it is connected to reference voltage $V_{SS}$ instead of $V_{RR}$. The purpose of reference injector 21 is to pass through diode-connected transistor 203 a reference charge which appears at node N2 as a charge of about 140 Femto Coulombs (140 × $10^{-15}$ Coulombs). (It is noted that this is the midpoint level between a zero and a one charge level representation, 50 and 230 Femto Coulombs respectively.) Similarly, the input signal CHARGE IN from the last site of output section 220 of the CCD register 200 passes through fully implanted gating site 311, through diode-connected transistor 202, and appears at node N1 as a charge of (approximately) either 50 or 230 Femto Coulombs. This charge level is inexact due to both noise and dissipation of charge during its transfer through the SPS register. Diode-coupled transistors 202 and 203 are essential to proper operation of the circuit. They act to lock in the charge packets delivered to nodes N1 and N2 respectively. The timing relationship of charge from reference injector 21 and from the output section 220 is as follows: charge is stored in sites coupled to phase A and is passed through gating sites 219, 311 coupled to phase B (or BIS). Gating site 311 is bidirectional and coupled to phase B which has only a 10 volt amplitude. Node N1 may be charged to a level of 12 volts. Unless node N1 is isolated by some other means from output section 220, charge will flow from node N1 into output section 220. The means for preventing this flow is diode-coupled transistor 202 which provides a unidirectional path from input terminal 301 to node N1. Transistor 203 provides a similar blocking role to the degree necessary (which is limited due to the coupling of gating site 209 to phase BIS) and also provides timing balance between nodes N1 and N2.

Differentiator 20 operates to detect the difference between the charge levels at node N1 and node N2. Upon receiving a signal from regenerator 22, a small difference in charge at nodes N1 and N2 is detected and amplified as described infra, and an appropriate logic level signal is sent to amplifier 24 over line 25.

The level of charge detected by differentiator 20 corresponds to approximately a 0.5 volt difference between node N1 and node N2. Node N2 (which contains the reference charge), will be at approximately 2.0 volts and node N1 will be 2.0 volts ± 0.5 (i.e. less than 2.0 volts if the charge packet contains only a fat zero, more than 2.0 volts if the charge packet also contains a signal charge).

Operation of differentiator 20 takes place in sequential steps. In a first step, as clock CL2 falls, nodes N1 and N2 are pre-charged (initialized) to an appropriate low level $V_{dd}$. In a second step, as phase A rises, charge packets from the CCD register and the reference injection are dumped onto nodes N1 and N2 respectively. The difference in the levels at the nodes is detected and converted to logic levels when the regenerator pulse goes on by action of the regenerator transistor 206 in combination with transistors 204 and 205. After this, the first step occurs again, wherein simultaneously with nodes N1 and N2 being pre-charged, the logic level signal which is stored in amplifier 24 is transmitted as output signal $V_{Sig}$ to injector 100.

To further explain this operation, during the first step, clock CL2 falls and nodes N1 and N2 are coupled via transistor 207 so as to balance the pre-charge levels (voltages) on these nodes. The balancing is to the level of $V_{dd}$. During the second step, charge is delivered to node N1 and node N2, since they are at a low level ($V_{dd}$) while the cells (217, 218 and the last cell of section 220) are brought to a high level by phase A. Accordingly, charge is dumped onto the nodes. Transistors 204, 205 are gated by the voltage level of nodes N1 and N2 respectively. However, one of these transistors 204, 205 is turned on more than the other, depending on which of nodes N1 and N2 is at the lower level (i.e. which mode has received the smaller charge packet). Due to the cross-coupling of nodes N1, N2 to transistors 204, 205, when the regenerator pulse goes on (low), regenerator transistor 206 is enabled and delivers $V_{SS}$ to transistors 204, 205 and the node which was (originally) higher receives most of the voltage supplied by $V_{SS}$, i.e. it goes to a significantly higher voltage level with respect to the other node. In this manner, the original minute difference between nodes N1 and N2 is amplified to a logic level corresponding to $V_{SS}$.

Of essence, in this operation of amplifier 300 is that the original very small differences in levels between signals are gating signals for transistors 204 and 205. These gating signals act to bring one of the nodes to $V_{SS}$ (12 volts) and hold the other relatively close to 2 volts (although it may rise to about 5 volts). Clearly, this is significant amplification of the difference: the original difference of 0.5 volts is amplified to approximately 7 volts, an amplification factor of almost 15.

The need for isolation of the operation of node N1 of differentiator 20 from the SPS register may now be more readily understood. When node N1 goes to $V_{SS}$, the input terminal 310 from the SPS register does not go all the way to $V_{SS}$. Terminal Point 301 goes only by capacitive action to an acceptable level not sufficient to inject charge back to the SPS register.

The signal from regenerator 22 enables differentiator 20 to convert the input charge levels to system level voltage levels by providing $V_{SS}$ as a voltage source. With the rising edge of clock CLP, the regenerator is turned on. (Clock CL2 turns off the regenerator.)

The operation of amplifier 24 is as follows. Firstly, it is noted that the input line 25 to amplifier 24 carries the inverse of the signal represented by the charge emitted from SPS register 200 (which has been amplified by the differentiator and is found on node N1). This signal is held on line 25 by transistors 209 and 242. (Transistor 242 acts like a very large resistance.) When clock CL1 turns on, amplifier 24 is prepared to accept a signal by precharging of point 240 to a low level. As clock CL1 turns off, but before clock CL2 turns on, the signal on line 25 is inverted as it is passed on to point 240 and trapped (stored) there. The storage capacity of point 240 is represented by capacitor C which may be inherent line capacitance. When clock CL1 is on, point 241 is charged to $V_{SS}$. As clock CL2 goes on, the signal stored at point 240 is passed on to point 241: if the signal is high, point 241 stays at $V_{SS}$; if the signal is low, point 241 is brought to $V_{dd}$. The voltage level at point 241 corresponds to $V_{Sig}$, the output signal of the sense amplifier 300 which is used as the input signal to injector 100. Accordingly, point 241 is equivalent to output terminal 399 of amplifier 300. In the preferred embodiment shown, amplifier 24 is simply used as an inverting and amplifying storage and refresh mechanism for the signal from differentiator 20 sent to the injector 100 via amplifier 24. In this manner, control circuitry is not provided to gate this mechanism and only a single mode of operation, REFRESH, is provided. Description of modification of the circuit so as to provide other modes of operation (READ, WRITE, PARTIAL-WRITE) is included infra.

Figure 5:
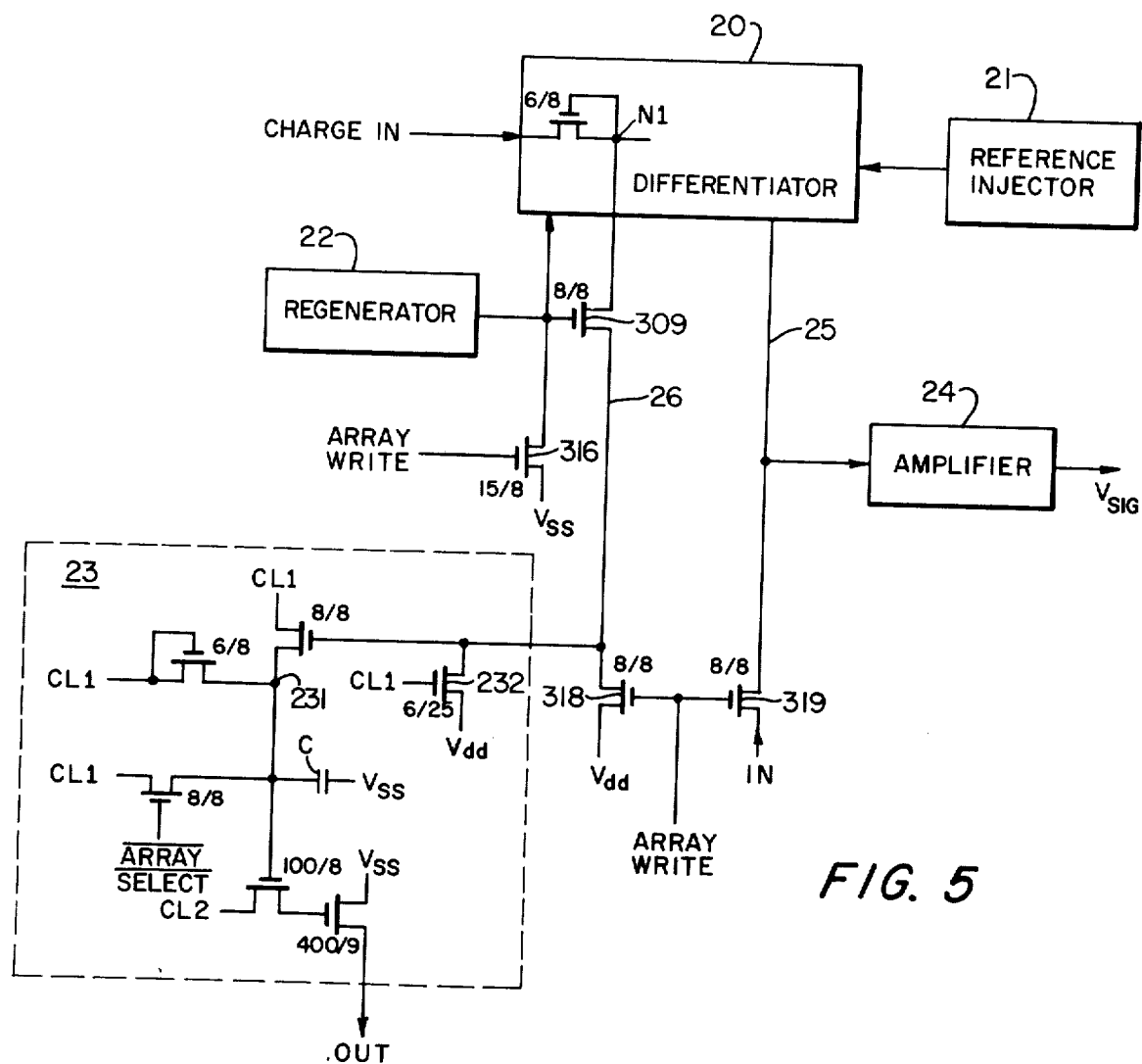
FIG. 5 is a diagram showing circuitry for utilization together with the circuit shown in FIG. 3 so as to provide the present invention.

Referring now to FIG. 5, interface circuitry used in combination with the circuit shown in FIG. 3 is shown. It is first noted that the control signals to the interface circuitry are ARRAY WRITE and ARRAY SELECT. These correspond to signals which are common for the plurality of registers which may form each array. The preferred operation of an array of registers is to operate (READ, WRITE or REFRESH) all of the registers in an array in parallel. Accordingly, all of the registers in the array have common control signals. Operation of the circuitry shown in FIG. 3, that is operation of a sense amplifier without any interface circuitry, would be strictly in a REFRESH mode. In other words, data would be transferred into sense amplifier 300, where charge packets would be detected and amplified, and then sent back through the injector 100 into the register 200 for storage once again. This transmission of data into, through and out of the register 200 is also required for operation in a READ mode. All that is additionally required to READ data is to sense the data after the charge packets have been amplified and to bus them outwards over a (bi-directional) data bus. Amplifier 23, responsive to an $\overline{\text{ARRAY SELECT}}$ signal, performs this function. Amplifier 23 is identical to amplifier 24 except as follows. Amplifier 23 is coupled to node N1 of differentiator 20 via transistor 309 and line 26. This is parallel to the coupling of amplifier 24 to node N2 via transistor 209. However, the signals provided to amplifiers 23 and 24 are inverses of each other. Similarly, the input signal to amplifier 23 is trapped there by transistors 309 and 232. This signal is inverted and conditionally stored at point 231 when clock CL1 turns off. The OUT signal is sent to the data bus. However, it appears as $V_{SS}$ only when clock CL2 goes on and the low voltage has been stored at point 231. In other words, the OUT signal takes place during clock CL2 time and is the inverse of the voltage level which has been conditionally stored at point 231. However, the voltage at point 231 was the inverse of the input voltage to amplifier 23. This generation of the OUT signal is modified by the $\overline{\text{ARRAY SELECT}}$ signal. When $\overline{\text{ARRAY SELECT}}$ is low while clock CL2 is on, point 231 is brought to CL1 (which is always off when CL2 is on) and $V_{SS}$ is not sent to the data bus at the OUT signal. $\overline{\text{ARRAY SELECT}}$ is low when the array is not selected since in MOS circuits, low signals correspond to "ON" and high signals correspond to "OFF". Accordingly, a high ($V_{SS}$) signal is sent as the OUT signal over the data bus only when the array has been selected and a signal charge 1 has been represented.

The WRITE mode of operation requires other than the simplified circuitry in combination with the sense amplifier. Once again, modification is preferably performed at an array level. Basically, it is desired to take the signal IN received via the data bus and transmit it to amplifier 24 and in turn to injector 100. However, it is required that the signal IN override any signal transmitted by the differentiator 20. Accordingly, the ARRAY WRITE signal is sent to transistor 316 to override any signals sent by regenerator 22 to differentiator 20 and to transistors 209 and 309. A (low) ARRAY WRITE signal is also used to enable transistors 318 and 319. Enabling of transistor 318 overrides the signals sent by differentiator 20 to amplifier 23 and hence disables the READ operation despite the presence of a high $\overline{\text{ARRAY SELECT}}$ signal. Enabling of transistor 319 couples the data bus to amplifier 24. In this manner, ogical signals are transmitted through amplifier 24 to injector circuit 100. A peculiarity of this embodiment of the present invention must be noted. As discussed above, amplifier 24 inverts its input signals prior to their transmission to injector 100. Accordingly, the signals stored in the CCD register are the inverse of the signals received as the IN signals during a WRITE operation. This inversion is not reinverted via a READ operation as above described, and therefore must be compensated for by other means.

The invention also allows a PARTIAL-WRITE mode of operating the CCD register system. It is assumed that each time the array is operated, a full cycle of operation results. This will correspond to a REFRESH mode unless altered by the control signals. A high $\overline{\text{ARRAY SELECT}}$ signal must be present for any particular access (READ or WRITE) of the array, otherwise REFRESH will occur. If $\overline{\text{ARRAY SELECT}}$ is high and ARRAY WRITE is high (off), amplifier 23 will receive signals via line 26 and transmit signals over the OUT line to the data bus. Simultaneously, amplifier 24 will receive signals via line 25 so the data will be restored in the register. In other words, a non-destructive READ will transpire. If $\overline{\text{ARRAY SELECT}}$ is high and ARRAY WRITE is low (on), amplifier 23 will not transmit signals and regenerator 22 will not enable differentiator 20. Instead, amplifier 24 will receive signals from the IN line and transmit them to the injector circuit for storage in the register. This corresponds to a WRITE Mode of operation. The WRITE may, however, be controlled bit-by-bit, i.e. a PARTIAL-WRITE may be initiated. WRITING of bits may be interspersed with either a READ of a bit or a REFRESH of the existing bit. These modes of operation are sufficiently distinct so as not to require the data bus simultaneously. In this manner, a bi-directional data bus may be employed. That is, when data bits are no longer bused into the register via the data bus carrying the IN signals, the interface circuitry automatically provides continued operation of the register in a REFRESH mode so as to complete a full cycle of operation of the register.

Prior art applications with a PARTIAL-WRITE are on RAMs (random access memories). In that manner, the WRITE operation was by nature a PARTIAL-WRITE or a WRITE Only on those specific parts of memory required. Since CCDs are by nature serial devices, PARTIAL-WRITE is a new operation in this serial sense. In the prior art, types of circuitry required to perform a PARTIAL-WRITE Involved numerous flip-flops and other types of storage and control devices. It should be noted that an external constraint in this operation is with two multiplexed external interface devices. As such, the insertion of additional control gates might interfere with the required speed of operation. It is noted that control functions generally cost 10–15% of the optimum speed, depending upon the number of control stages which must be utilized. However, the PARTIAL-WRITE circuitry of the present invention is obtained with utilization of a minimum number of gates and amount of space.

In the preferred embodiment, all transistors are MOSFET transistors. Accordingly, low signals enable the transistors and high signals turn the transistors off. In the diagrams, sizes for the transistors are given in terms of surface area of a semiconductor chip. The sizes are shown as width over length (w/l) in microns and are not in anyway meant to be restrictive as alternate geometries may be employed to the same effect.

The above description is included to illustrate the operation of the preferred embodiment and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. In a data processing system, apparatus for interfacing between a CCD register system and said data processing system, said apparatus comprising:
   reference means for generating a reference charge;
   differentiator means coupled to a CCD register and to said reference means for comparing packets of charge to said reference charge, said differentiator means generating a first signal proportional to one of said packets of charge;
   data busing means for transmitting logic signals to and from said apparatus and said data processing system;
   first amplifier means controllably coupled to said differentiator means for amplifying said first signal, and to said data busing means for amplifying said logic signals;
   second amplifier means controllably coupling said differentiator means to said data busing means;
   first means for receiving a signal corresponding to a WRITE mode of operation;
   second means for receiving a signal indicating selection of said CCD register;
   third means responsive to said first means for inhibiting the operation of said differentiator means, said third means also inhibiting the coupling of said first and said second amplifier means to said differentiator means and enabling the coupling of said first amplifier means to said data busing means; and
   fourth means responsive to said second means for inhibiting said coupling of said data busing means to said second amplifier means.

2. The apparatus of claim 1 wherein said apparatus is integrated within a semiconductor chip comprising said CCD register system.

3. The apparatus of claim 1 wherein said differentiator means further comprises:
   first and second nodes, and
   first and second diode-coupled transistors coupling said first and said second nodes to said CCD register and said reference means respectively,
   wherein said first and said second diode-coupled transistors inhibit said CCD register and said reference means from receiving charge from said first and said second nodes, respectively.

4. The apparatus of claim 3 wherein said differentiator means further includes:
   first and second amplifying transistors coupling said second and said first nodes, respectively, to a system level votage;
   said first and said second nodes being charged to levels corresponding to said reference charge and said one packet of charge respectively;
   said first and said second amplifying transistors having gating terminals coupled to said first and said second nodes respectively, said first and said second amplifying transistors enabled to conduct different amounts of charge proportional to the difference between said reference charge and said one packet of charge.

5. The apparatus of claim 1 wherein said reference means includes a clocked-source, a storage site coupled to receive charge from said clocked source and a forward blocking gate coupling said forward blocking gate to said differentiator means.

6. An integrated circuit for providing an interface between a CCD register system and a data processing system comprising:
   reference means for generating a reference charge;
   difference means responsive to a control signal comprising:
      first input means for receiving packets of charge from a CCD register;
      second input means for receiving said reference charge;
      control means for generating said control signal;
      first and second amplifying transistors having enabling terminals coupled to said first and said second input means respectively, said first and said second amplifying transistors enabled to conduct different amounts of charge corresponding to the difference between said reference charge and one of said packets of charge;
      a control transistor with its gating terminal coupled to receive said control signal for coupling a terminal of said first amplifying transistors and a terminal of second amplifying transistor to a system level voltage,
   said difference means in response to said control means generating at the other terminal of said first amplifying transistor a logic signal corresponding to said one packet of charge;
   first amplifier means coupled to said difference means for amplifying said logic signal;
   second amplifier means coupled to said difference means for amplifying the inverse of said logic signal;
   data busing means controllably coupled to said first amplifying means for transmitting signals to said circuit and controllably coupled to said second amplifying means for transmitting signals from said apparatus;
   switching means for inhibiting the operation of said control means and for uncoupling said second amplifier means from said difference means and for coupling said data busing means to said first amplifying means; and
   disabling means for inhibiting coupling of said second amplifying means to said data busing means.

7. The circuit of claim 6 wherein said difference means further includes first and second diode-coupled transistors coupling said first input means to said CCD register and said second input means to said reference means respectively, said diode-coupled transistors providing a unidirectional transfer path into said difference means.

* * * * *